United States Patent [19]

Inaba et al.

[11] Patent Number: 4,510,443
[45] Date of Patent: Apr. 9, 1985

[54] VOLTAGE MEASURING DEVICE

[75] Inventors: Ritsuo Inaba, Hirakata; Kiyotaka Wasa, Nara, both of Japan

[73] Assignee: Matsushita Electric Industrial Co., Ltd., Kadoma, Japan

[21] Appl. No.: 492,160

[22] Filed: May 11, 1983

Related U.S. Application Data

[63] Continuation of Ser. No. 187,079, Sep. 15, 1980, abandoned.

[30] Foreign Application Priority Data

Sep. 19, 1979 [JP] Japan .................................. 54-121176

[51] Int. Cl.³ ...................... G01R 19/26; G01R 29/12
[52] U.S. Cl. .................................... 324/120; 324/457; 355/3 CH
[58] Field of Search ................ 324/120, 109, 457, 72; 331/107 A; 332/26; 329/117, 119; 310/313 R, 313 B; 333/195; 355/3 CH, 14 CH

[56] References Cited

U.S. PATENT DOCUMENTS 3,293,557 12/1966 Denton ........................... 331/107 A
4,233,573 11/1980 Grudkowski .................... 331/107 A

FOREIGN PATENT DOCUMENTS 614518 7/1978 U.S.S.R. ................................ 332/26

OTHER PUBLICATIONS

"SAW Oscillator . . . "; Electronic Design; No. 25; Dec. 6, 1977; p. 38.

Primary Examiner—Ernest F. Karlsen
Attorney, Agent, or Firm—Wenderoth, Lind & Ponack

[57] ABSTRACT

A voltage measuring device includes a surface acoustic wave propagating medium and transmitting and receiving transducers coupled to the medium. An electrode that receives an unknown voltage is applied to the medium for effecting, when the unknown voltage is supplied, a frequency change in the acoustic wave propagating through the medium. A detector is provided for detecting the frequency change which is an indication of voltage supplied to the electrode.

3 Claims, 7 Drawing Figures

VOLTAGE MEASURING DEVICE

This is a continuation of now abandoned application Ser. No. 187,079, filed Sept. 15, 1980.

BACKGROUND OF THE INVENTION

The present invention relates to a voltage measuring device, and more particularly, to a compact size voltage measuring device which can measure a wide range of voltage with a high accuracy.

To be an excellent voltage measuring device, it is desired that the voltage measuring device has a high input impedance, a high durability against high voltage, a high stability against temperature change, a high accuracy in displaying the measured voltage, and that it operates stably with low noise.

For obtaining the high input impedance, a vacuum tube has been widely used. However, the vacuum tube has disadvantages in that its performance is unstable and in that it produces high heat generated noise. Moreover, its size is very large. Recently, in place of the vacuum tube, a field effect transistor (FET) also having a high input impedance has become popular. When compared with the vacuum tube, the field effect transistor performs more stably with less heat noise, and can be assembled in a compact size. However, the voltage durability, or dielectric resistance, of the FET is so poor that it only can endure up to several 10's of volts under normal conditions.

In the field of electronics, many devices nowadays require a high voltage for their operation. For example, an electrophotographic copying machine requires several 100's to several 1000's of volts for its operation. For measuring such high voltage, an FET is an inappropriate element to be employed in the voltage measuring device.

SUMMARY OF THE INVENTION

Accordingly, it is a primary object of the present invention to provide a voltage measuring device which has a high input impedance and can measure a wide range of voltages.

It is another object of the present invention to provide a voltage measuring device of the above described type which has a high stability against temperature change.

It is a further object of the present invention to provide a voltage measuring device of the above described type which can be assembled in a compact size with a low manufacturing cost.

In accomplishing these and other objects, a voltage measuring device according to the present invention comprises a medium for propagating surface acoustic waves, a first transducer means coupled to the medium for launching surface acoustic waves through the medium when an input a.c. signal is applied thereto, and a second transducer means coupled to the medium for receiving surface acoustic waves propagated thereto from the first transducer means and for converting the received acoustic waves into an output a.c. signal. An electrode member for receiving a voltage to be measured is provided to effect an electric field change in the medium by the received voltage. The device further comprises means for detecting the frequency change in the output a.c. signal caused by the change in the electric field in the medium. The frequency change is an indication of the voltage applied to the electrode.

BRIEF DESCRIPTION OF THE DRAWINGS

These and other objects and features of the present invention will become apparent from the following description taken in conjunction with preferred embodiments thereof with reference to the accompanying drawings, throughout which like parts are designated by like reference numerals, and in which.

DETAILED DESCRIPTION OF THE INVENTION

Figure 2:
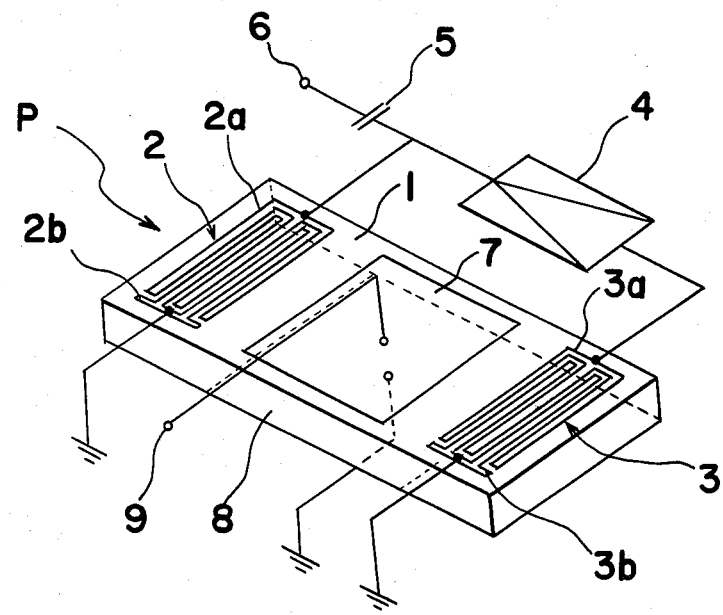
FIG. 2 is a perspective view of a piezoelectric unit employed in the voltage measuring device of FIG. 1.
Figure 1:
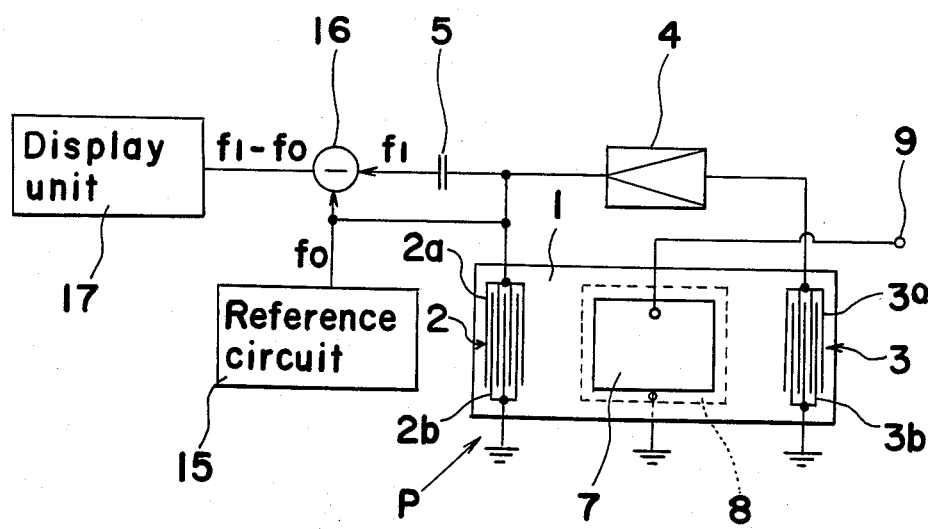
FIG. 1 is a schematic view showing an arrangement of a voltage measuring device according to the first embodiment of the present invention.

Referring to FIG. 1, a voltage measuring device according to the first embodiment of the present invention comprises a piezoelectric unit P, a reference signal producing circuit 15, a comparator 16 and a display unit 17. The piezoelectric unit P, as best shown in FIG. 2, comprises a rectangular plate 1 made of a piezoelectric material, such as a magnesium niobate titanate lead zirconate ($MgNbTiZrPbO_3$). The plate 1 has a transmitting, or launching, transducer 2 and a receiving transducer 3 formed at opposite end portions of one flat surface of the piezoelectric plate 1. In the embodiment shown, the transmitting transducer 2 includes a pair of thin-film metal electrodes 2a and 2b arranged in the shaped of combs with interdigitated teeth. Similarly, the receiving transducer 3 includes interdigitated electrodes 3a and 3b. Provided between the transmitting and receiving transducers 2 and 3 is an electrode 7 deposited on one flat surface of the plate 1. The electrode 7 is connected to a terminal 9 which is adapted to receive a voltage to be measured. A counter electrode 8 which is grounded is deposited on the other flat surface of the plate 1 facing the electrode 7. The electrodes 2a, 2b, 3a, 3b, 7 and 8 can be formed by any known method, such as sputtering or vacuum depositing using a high electric conductive material such as aluminum or gold.

Now a detailed connection to the piezoelectric unit P is explained.

Referring particularly to FIG. 1, the comb-shaped electrode 2a of the transducer 2 is connected to the reference signal producing circuit 15 which produces a reference a.c. signal, and the comb-shaped electrode 2b is connected to ground. The comb-shaped electrode 3a of the receiving transducer 3 is connected through an amplifier 4 to the electrode 2a for feeding the received signal back to the electrode 2a. The comb-shaped electrode 3b is connected to the ground. The output of the amplifier 4 is also connected through a capacitor 5 to the comparator 16 which is also connected to the reference signal producing circuit 15. The output of the comparator 16 is connected to the display unit 17.

When the reference signal producing circuit 15 is so actuated as to produce an a.c. signal having a predetermined center frequency $f_0$, an alternating electric field is generated between the electrodes 2a and 2b that causes localized vibrations in the plate 1. These vibrations give rise to acoustic waves, which propagate along a path defined on the surface of the plate 1 in a direction perpendicular to the teeth of the electrodes, i.e., towards the receiving transducer 3. At the receiving transducer 3, the propagated acoustic waves are converted to a.c. signal which is fed through the amplifier 4 back to the electrode 2a.

According to one preferred embodiment, the plate 1 has a dimension of 0.7 mm thick and 10 mm long, while the interdigitated electrodes 2a and 2b are so arranged as to generate acoustic waves having a wave length of 300 μm so that the frequency of the acoustic waves propagated through the plate 1 is, when no voltage is applied to the terminal 9, 7.21948 MHz at 25° C. It is understood that the frequency 7.21948 MHz can be considered as a natural frequency of the plate 1 when no voltage is applied to the terminal 9. When the signal from the electrode 3a is fed back to the electrode 2a, and if the phase of the fed back signal matches with the acoustic waves generated from the transducer 2, the voltage of the output a.c. signal from the transducer 3 saturates to produce an oscillating signal from the output of the amplifier 4. The frequency of the oscillating signal will be identical to the frequency of the natural frequency of the plate 1. Accordingly, when no voltage is applied to the terminal 9, the frequency of the oscillating signal will be 7.21948 MHz.

Figure 3:
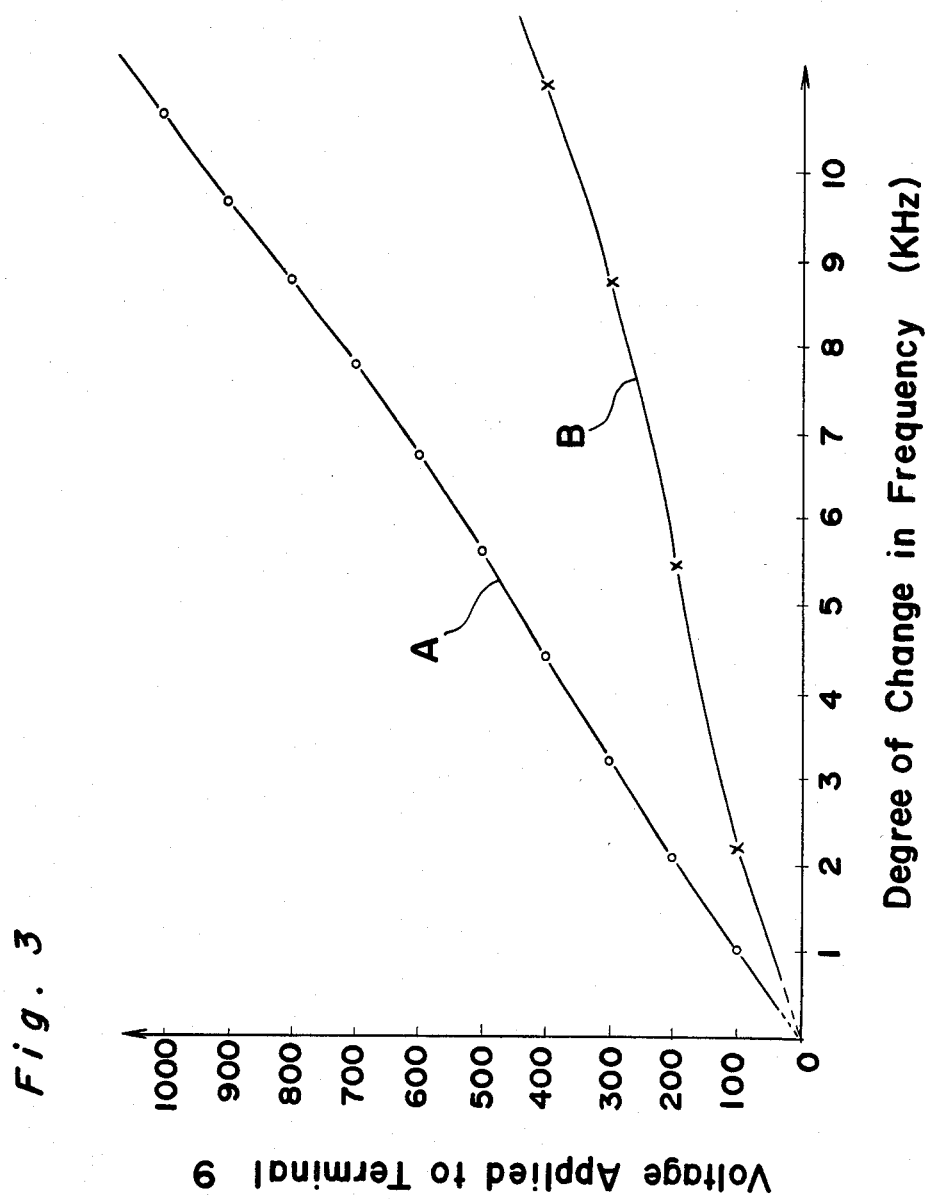
FIG. 3 is a graph showing a voltage-frequency characteristic of the piezoelectric unit of FIG. 2.

When a voltage is applied to the terminal 9, the plate 1, particularly the crystal structure in the plate 1 is deformed to change the effective length of path for the acoustic wave propagation. Furthermore, the applied voltage causes an electric field change in the path to change the propagation path of the acoustic waves. Accordingly, as a result, the natural frequency of the plate 1 changes and thus, the frequency of the oscillating signal changes. The degree of change of the natural frequency of the plate 1 (the degree of change of the oscillating frequency of the plate 1) with respect to the change of the applied voltage depends on the capacitance between the electrode 7 and the counter electrode 8. FIG. 3 shows a voltage-frequency characteristic of the piezoelectric unit P in which lines A and B are obtained when the capacitance between the electrodes 7 and 8 are 20 pF and 67.5 pF, respectively. Once the capacitance between the electrodes 7 and 8 is fixed, the natural frequency of the plate 1 varies almost proportionally to the change of the voltage applied to the terminal 9. Accordingly, if the frequency change is measured, it is possible to tell the voltage applied to the terminal 9.

The frequency change is obtained by the comparator 16 which compares the frequency $f_0$ of the a.c. signal from the reference circuit 15 with the frequency $f_1$ of the oscillating signal produced from the piezoelectric unit P. If the frequency $f_0$ from the reference circuit 15 is so selected as to be equal to 7.21948 MHz, and when no voltage is applied to the terminal 9, the comparator 16 produces a zero level signal. When the terminal 9 is supplied with a voltage, the frequency $f_1$ is increased. The degree of increase $f_1 - f_0$ is calculated in the comparator 16 and is fed to the display unit 17. In the display unit 17, the degree of increase of frequency $f_1 - f_0$ is changed to a voltage value by the use of formula obtained from the voltage-frequency characteristic line of the piezoelectric unit in use. The display unit 17 can be of any known digital or analogue type that may show the calculated voltage which corresponds to the voltage supplied to the terminal 9.

Since the piezoelectric unit 1 has a high input impedance, and a high durability against high voltage, and since it operates stably with low noise, it can be used to measure a wide range of voltages from the order of 1's to 1000's of volts. The upper limit of the range depends on the dielectric strength of the piezoelectric plate 1.

It is to be noted that the voltage measuring device of the present invention can be used as a voltage detector for detecting high voltages that should be controlled. For example, in an electrophotographic copying machine, the device of the present invention can be used to detect the voltage of a charged toner.

In the above arrangement of the voltage measuring device, when $MgNbTiZrPbO_3$ is used for the piezoelectric plate 1, its dimension change relative to the temperature change counterbalances its elastic constant change relative to the temperature change. Accordingly, the voltage-frequency characteristic obtained by the piezoelectric unit P using $MgNbTiZrPbO_3$ scarcely changes with respect to temperature changes.

It is to be noted that the piezoelectric material, which has been described as $MgNbTiZrPbO_3$, can be any other known material, such as, a ceramic of titanate lead zirconate, lead zirconate, lead titanate, or barium titanate, or a single crystal of bismuth germanite, bismuth silicate, lead-titanate-zirconate, lithium niobate, lithium tantalate, quartz, Rochelle salt, zinc oxide, zinc sulfide, cadmium sulfide, or aluminum nitrate. Of all the materials listed above, however, it has been found that the single crystal of lithium niobate and lithium tantalate have a voltage-frequency characteristic as sensitive and stable as that of the $MgNbTiZrPbO_3$, as exhibited in FIG. 3. Furthermore, since lithium niobate and lithium tantalate are a single crystal, they show a stable operation during a long period of time.

Figure 4:
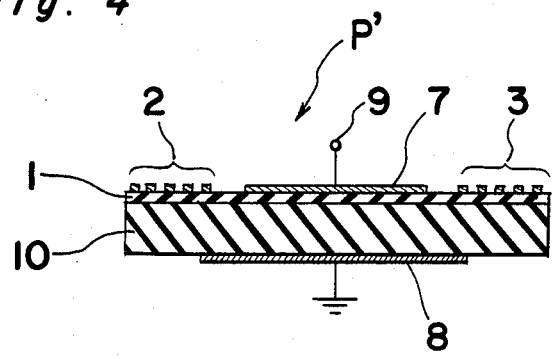
FIGS. 4, 5 and 6 are cross-sectional views showing modifications of the piezoelectric unit of FIG. 2.

Referring to FIG. 4, there is shown a modified piezoelectric unit P'. In this modification, the piezoelectric plate 1 is deposited over a substrate 10 made of non-piezoelectric material, such as a silica glass or a borosilicate glass. This arrangement is advantageous in that not only is the structure of the piezoelectric unit reinforced, but the stability against the temperature changes is also improved, as explained below.

When the piezoelectric plate 1 has an elastic temperature constant $\alpha$, the material for the substrate 10 is selected to have an elastic temperature constant $-\alpha$. When the plate 1 and the substrate 10 are combined together, the elastic temperature constant $\alpha$ of the plate 1 counterbalances the elastic temperature constant $-\alpha$ of the substrate 10 to substantially provide an elastic temperature constant of zero.

For example, when a piezoelectric plate 1 which is made of a thin film of zinc oxide having a thickness of 40 to 50% of the acoustic wave length is deposited over a substrate 10 made of silica glass by the method of sputtering, the frequency deviation caused by the temperature change can be reduced to less than 10 ppm/° C. By this arrangement, the error in the measured voltage is less than 1% at 1000 V.

Therefore, by the arrangement of FIG. 4, the deviation, or error, in the measured voltage caused by temperature changes can be compensated for.

Figure 5:
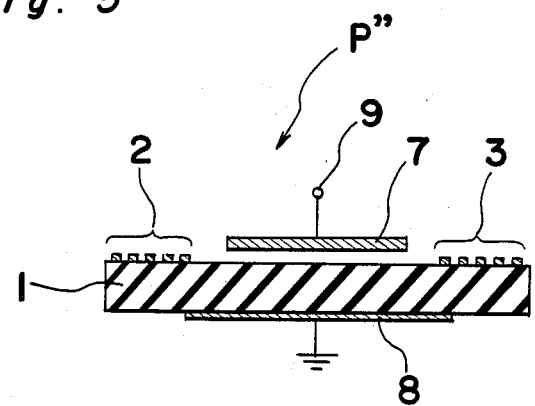
Figure 6:
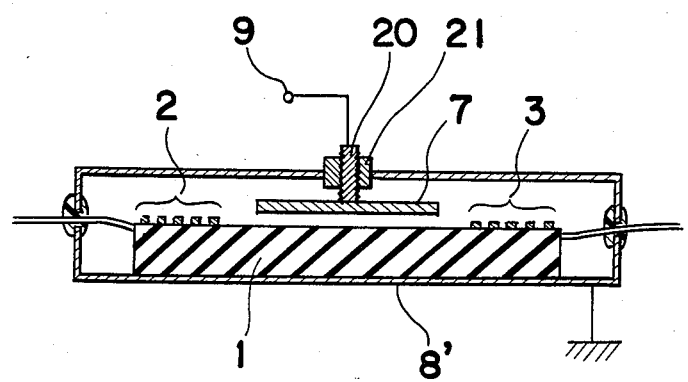

Referring to FIG. 5, there is shown another modified piezoelectric unit P". In this modification, the electrode 7 is placed a predetermined distance above the piezoelectric plate 1 to control the capacitance between the electrodes 7 and 8. When the distance becomes larger, the capacitance between the electrodes 7 and 8 becomes small, so that the effect of the electric field change caused by the voltage applied to the terminal 9 is weakened. Accordingly, a wider range of voltages can be measured. On the contrary, when the distance becomes smaller, the effect of the electric field change is strengthened. In this case, a precise measurement can be carried out. One embodied arrangement of the piezoelectric unit P" is shown in FIG. 6, which comprises a metal casing 8' in which the piezoelectric plate 1 is rigidly installed. The metal casing 8' is grounded and serves as the counter electrode described above. A nut 21 is rotatably mounted in a top plate of the casing 8' and is insulated from the casing 8 by a suitable insulating member. A bolt 20, connected to the terminal 9 and extending perpendicularly from the electrode 7, is screwed into the nut 21, so that when the nut 21 is rotated, the bolt 20 moves up and down to control the position of the electrode 7 above the plate 1. In this modification, as long as the electrode 7 is held away from the electrodes of the transducers 2 and 3, it is possible to locate the electrode 7 directly above the transducers 2 and/or 3 by shifting the position of the electrode 7 or by enlarging the size of the electrode 7. In this arrangement, it is preferable to form the electrode 7 from a metal plate, such as a stainless steel plate.

Figure 7:
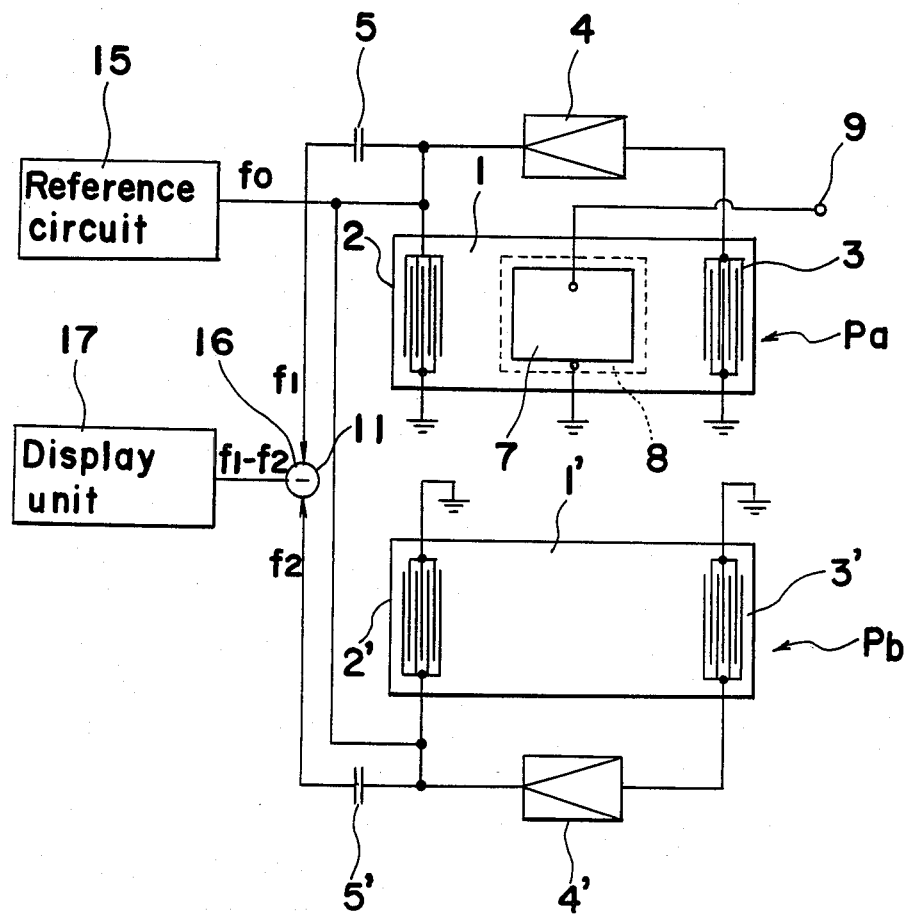
FIG. 7 is a schematic view showing an arrangement of a voltage measuring device according to the second embodiment of the present invention.

Referring to FIG. 7, a voltage measuring device according to the second embodiment of the present invention comprises two piezoelectric units Pa and Pb, in which the structure of the piezoelectric unit Pa is identical to that described in the first embodiment. The piezoelectric unit Pb includes a piezoelectric plate 1' having the same configuration and size as that of the plate 1 and transducers 2' and 3' which are arranged on the plate 1' exactly the same manner as the transducers 2 and 3 are arranged on the plate 1. The transducer 2' is connected to the reference signal producing circuit 15 and the transducer 3' is connected through an amplifier 4' and a capacitor 5' to the comparator 16. The comparator 16 is also connected to the output of the piezoelectric unit Pa. The output of the comparator 16 is connected to the display unit 17. The operation of the voltage measuring device of FIG. 7 is as follows.

When the reference signal producing circuit 15 is actuated, it provides an a.c. signal to the transducers 2 and 2' to cause the transducers 2 and 2' to generate acoustic waves. The generated acoustic waves are transmitted to the respective receiving transducers 3 and 3' in which the received acoustic waves are converted to a.c. signals which are in turn fed back to the transmitting transducers 2 and 2', respectively, to cause oscillation in the piezoelectric units Pa and Pb. The oscillating signals produced from the units Pa and Pb are supplied to the comparator 16 which compares the frequency difference therebetween.

When no voltage is supplied to terminal 9, oscillating signals produced from the piezoelectric units Pa and Pb have the same frequency. Thus, the comparator 16 produces a zero level signal indicative of no frequency difference between the oscillating signals. As a consequence, the display unit 17 indicates that the voltage supplied to terminal 9 is zero.

When an unknown voltage is supplied to terminal 9, the piezoelectric plate 1 is deformed to change the frequency of the oscillating signal produced from the piezoelectric unit Pa whereas the piezoelectric unit Pb produces an oscillating signal with frequency which is the same as that of the oscillating signal produced from the piezoelectric unit Pa when no voltage is supplied to terminal 9. Accordingly, in this case, the comparator 16 produces a signal indicative of the frequency change caused by the voltage supplied to terminal 9. Upon receipt of the signal from the comparator 16, the display unit 17 calculates and then indicates the voltage that corresponds to the unknown voltage supplied to terminal 9.

According to the arrangement of FIG. 7, since the piezoelectric units Pa and Pb are disposed under the same condition, the units Pa and Pb equally receive the influences of temperature changes. Accordingly, if the oscillating signal produced from the piezoelectric unit Pa has some degree of frequency change caused by a temperature change, such a frequency change will be also included in the oscillating signal produced from the piezoelectric unit Pb. Thus, when the signals from the units Pa and Pb are compared, only the frequency change caused by the voltage supplied to terminal 9 will be produced from the comparator 16.

According to the voltage measuring device of the second embodiment, its operation is much more stable than that of the first embodiment with the employment of piezoelectric unit P' of FIG. 4. According to actual tests, the voltage measuring device of the second embodiment showed a $10^{-1}$ to $10^{-2}$ times smaller rate of frequency change relative to the temperature than that obtained from the voltage measuring device of FIGS. 1 or 4. More specifically, the voltage measuring device of the second embodiment showed less than 10 ppm of error of the carrier frequency even when the temperature is changed from $-20°$ to $80°$ C. When the voltage measuring device of the second embodiment was installed in an isothermal container, it showed less than 0.1 ppm of error of the carrier frequency.

Although the present invention has been fully described with reference to several preferred embodiments, many modifications and variations thereof will now be apparent to those skilled in the art, and the scope of the present invention is therefore to be limited not by the details of the preferred embodiments described above, but only by the terms of appended claims.

What is claimed is:

1. A voltage measuring device for receiving and measuring a voltage to be measured and for providing an output signal corresponding thereto, said device comprising:

a first medium of the double layer type for propagating surface acoustic waves, said first medium comprising a piezoelectric thin film which is laminated on a substrate comprising a non-piezoelectric material;

a first transducer means coupled to said first medium for launching surface acoustic waves through said first medium when an input a.c. signal is applied thereto;

a second transducer means coupled to said first medium for receiving surface acoustic waves propagated thereto from the first transducer means and for converting the received acoustic waves into a first output a.c. signal;

electrode members for receiving said voltage to be measured and for effecting an electric field change in the first medium by said received voltage, said electrode members comprising a continuous body which is disposed so as to cover an area located between said first and second transducers, wherein said first medium is interposed therebetween; and a detecting means for detecting the frequency change in said first output a.c. signal caused by the distortion of said piezoelectric thin film which is in turn caused by the change in said electric field in said first medium and for providing an output signal corresponding thereto, said frequency change being representative of said voltage to be measured;

wherein said output signal from said detecting means comprises said output signal of said device.

2. A voltage measuring device as claimed in claim 1, wherein said piezoelectric thin film comprises a ceramic selected from the group consisting of a single crystal of lithium niobate, a single crystal of lithium tantalate, and magnesium niobate titanate lead zirconate (MgNbTiZr-PbO$_3$).

3. A voltage measuring device as claimed in claim 1, wherein said piezoelectric thin film constricts and expands when a voltage is applied to said electrode members, so as to change the effective length of a path for said acoustic waves which are propagated between said first and second transducer means.

* * * * *